(12) United States Patent
Kushnir et al.

(10) Patent No.: US 8,406,709 B2
(45) Date of Patent: Mar. 26, 2013

(54) CARRIER RECOVERY IN RE-MODULATION COMMUNICATION SYSTEMS

(75) Inventors: Igal (Yehuda) Kushnir, Azur (IL); Jonathan Friedmann, Tel Aviv (IL); Ronen Shaked, Netanya (IL); Tzahi Oren, Kfar Saba (IL)

(73) Assignee: Provigent Ltd., Herzliya (IL)

( * ) Notice: Subject to any disclaimer, the term of this patent is extended or adjusted under 35 U.S.C. 154(b) by 68 days.

(21) Appl. No.: 13/035,972

(22) Filed: Feb. 27, 2011

(65) Prior Publication Data
US 2012/0220246 A1 Aug. 30, 2012

(51) Int. Cl.
*H04B 1/04* (2006.01)
(52) U.S. Cl. ............. 455/118; 455/95; 455/207; 455/39
(58) Field of Classification Search .................. 455/118, 455/95, 207, 39
See application file for complete search history.

(56) References Cited

U.S. PATENT DOCUMENTS

| | | | |
|---|---|---|---|
| 4,031,469 A | 6/1977 | Johnson | |
| 4,302,842 A | 11/1981 | Huriau | |
| 6,002,375 A | 12/1999 | Corman et al. | |
| 6,006,069 A | 12/1999 | Langston | |
| 6,418,301 B1 | 7/2002 | Le et al. | |
| 6,701,264 B2 | 3/2004 | Caso et al. | |
| 6,844,787 B2 * | 1/2005 | Vann et al. ............ 332/103 | |
| 6,965,633 B2 | 11/2005 | Sun et al. | |
| 7,176,589 B2 | 2/2007 | Rouquette | |
| 7,181,205 B1 | 2/2007 | Scott et al. | |
| 7,433,298 B1 | 10/2008 | Narasimhan | |
| 2002/0168952 A1 | 11/2002 | Vishakhadatta et al. | |
| 2003/0157915 A1 | 8/2003 | Atkinson et al. | |
| 2004/0071165 A1 | 4/2004 | Redfern et al. | |
| 2004/0072547 A1 | 4/2004 | Axness et al. | |
| 2004/0136317 A1 | 7/2004 | Mohan | |
| 2004/0141469 A1 | 7/2004 | Jung et al. | |
| 2004/0166799 A1 | 8/2004 | Kral | |
| 2005/0124307 A1 | 6/2005 | Ammar et al. | |
| 2005/0174954 A1 | 8/2005 | Yun et al. | |
| 2006/0052066 A1 | 3/2006 | Cleveland et al. | |

(Continued)

FOREIGN PATENT DOCUMENTS

| GB | 2412541 A | 9/2005 |
|---|---|---|
| WO | 02/058270 A3 | 7/2002 |

(Continued)

OTHER PUBLICATIONS

Friedmann, J., U.S. Appl. No. 12/553,101 "Receiver with re-demodulation", filed Sep. 3, 2009.

(Continued)

*Primary Examiner* — Sanh Phu
(74) *Attorney, Agent, or Firm* — Sterne, Kessler, Goldstein & Fox P.L.L.C.

(57) ABSTRACT

A communication apparatus includes transmission circuitry and a frequency conversion unit. The transmission circuitry is configured to down-convert an input Intermediate Frequency (IF) signal using a transmit (TX) Local Oscillator (LO) signal so as to produce a TX baseband signal, to up-convert the TX baseband signal to produce an output Radio Frequency (RF) signal, and to send the output RF signal to an antenna. The frequency correction unit is configured to estimate a frequency of the TX baseband signal or of the input IF signal, and to adjust the TX LO signal based on the estimated frequency so as to cause the transmission circuitry to down-convert the input IF signal to a predefined target frequency.

20 Claims, 3 Drawing Sheets

U.S. PATENT DOCUMENTS

| | | | |
|---|---|---|---|
| 2007/0105504 A1 | 5/2007 | Vorekamp et al. | |
| 2009/0124213 A1 | 5/2009 | Rubin et al. | |
| 2009/0170452 A1 | 7/2009 | Rubin et al. | |
| 2011/0053536 A1* | 3/2011 | Friedmann | 455/207 |

FOREIGN PATENT DOCUMENTS

| | | | |
|---|---|---|---|
| WO | 03/071723 | A1 | 8/2003 |
| WO | 03/090011 | A2 | 10/2003 |
| WO | 2004/056013 | A1 | 7/2004 |
| WO | 2009/063447 | A2 | 5/2009 |
| WO | 2009/083949 | A2 | 7/2009 |
| WO | 2009082457 | A1 | 7/2009 |

OTHER PUBLICATIONS

Snaked, R., U.S. Appl. No. 12/702,351 "Correction of Alternating I/Q Imbalance and Frequency Offset Impairments", filed Feb. 9, 2010.

W. Winkler et al., "High-Frequency Low-Noise Amplifiers and Low-Jitter Oscillators in SiGe:C BiCMOS Technology", Proceedings of SPIE International Symposium on Fluctuations and Noise, vol. 5470, Noise in Devices and Circuits II, pp. 185-192, Maspalomas, Gran Canaria (Spain), May 2004.

Mimix Broadband, Inc., "10.0-18.0 GHz GaAs MMIC Transmitter", Revision 1, Houston, USA, Mar. 2007.

Intel, "RF System and Circuit Challenges for WiMAX", vol. 8, issue 3, ISSN 1535-864X, Aug. 20, 2004.

International Application PCT/IL2008/001514 Search Report dated Apr. 2, 2009.

International Application PCT/IL2008/000981 Search Report dated Nov. 10, 2008.

Sierra Monolithics Inc, "RFICs and Evaluation Boards for WiMAX", USA, 2007 http://monolithics.com/wb/pages/products/broadband-wireless.php.

Gilbert, B., "A Precise Four-Quadrant Multiplier with Subnanosecond Response", IEEE Journal of Solid-State Circuits, vol. 3, Issue 4, pp. 365-373, Dec. 1968.

"ISSCC: SiGe frequency synthesizer for 60 GHz", Heise Zeitschriften Verlag, 2005.

Klepser et al., "A 10-GHz SiGe BiCMOS Phase-Locked-Loop Frequency Synthesizer", IEEE Journal of Solid-State Circuits, vol. 37, No. 3, pp. 328-335, Mar. 2002.

D'Andrea et al., "Design of Quadricorrelators for Automatic 30 Frequency Control Systems", IEEE Transactions on Communications, vol. 41, No. 6, Jun. 1993.

* cited by examiner

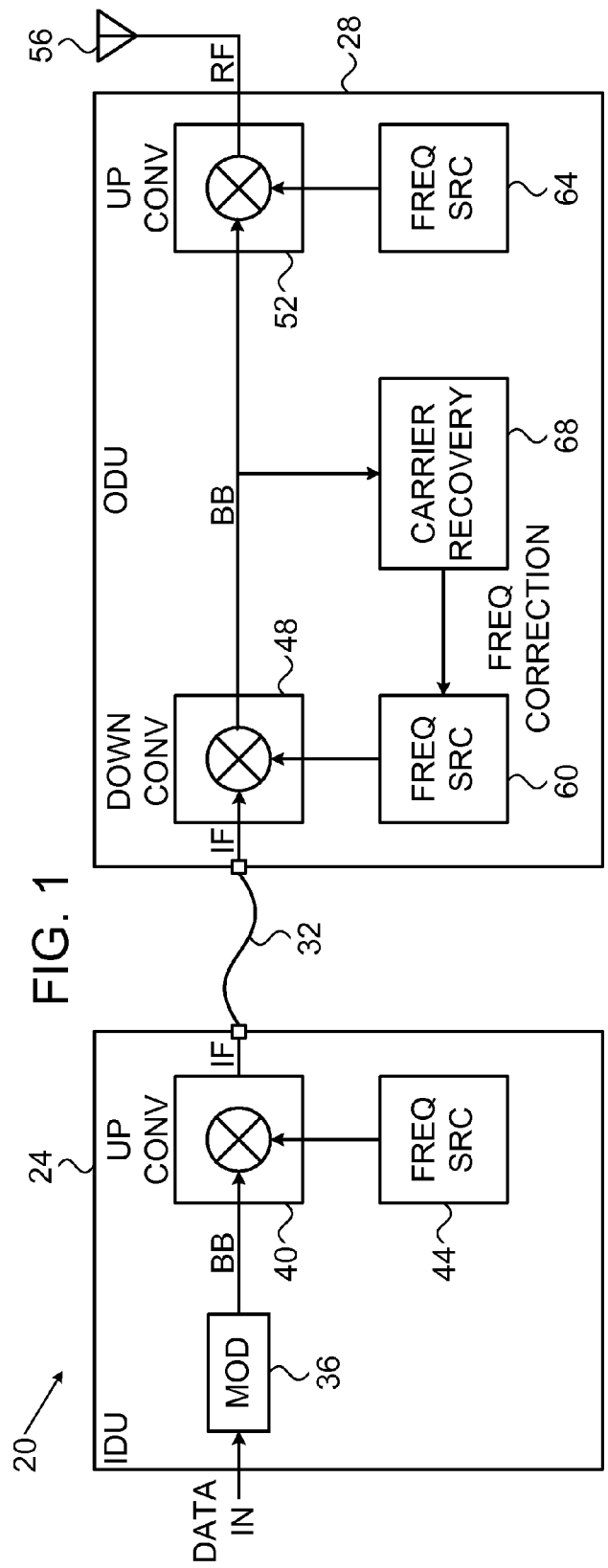
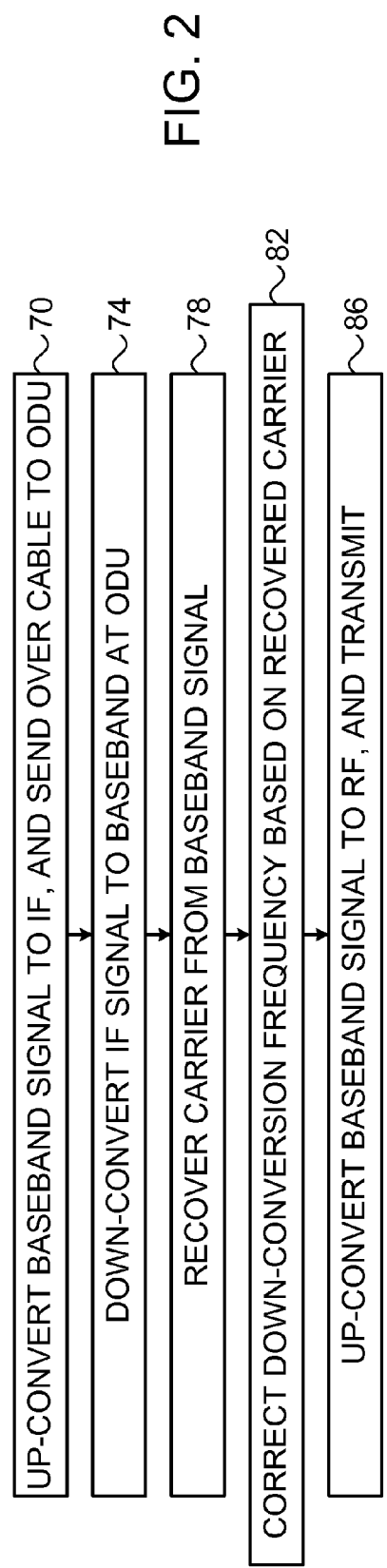

CARRIER RECOVERY IN RE-MODULATION COMMUNICATION SYSTEMS

FIELD OF THE INVENTION

The present invention relates generally to communication systems, and particularly to frequency conversion in re-modulation communication systems.

BACKGROUND OF THE INVENTION

Some communication systems, e.g., microwave links, partition the system circuitry between an Outdoor Unit (ODU) and an Indoor Unit (IDU). For example, U.S. Patent Application Publication 2005/0124307, whose disclosure is incorporated herein by reference, describes an indoor unit (IDU) and compact outdoor unit (ODU) having an intermediate frequency/modem circuit, millimeter wave transceiver circuit, and digital interface between the IDU and the ODU.

Some transmitter configurations use re-modulation techniques. For example, U.S. Pat. No. 6,844,787, whose disclosure is incorporated herein by reference, describes a system that performs a first modulation at an arbitrary frequency and a second modulation at another arbitrary frequency. In order to achieve this goal, the system demodulates the first modulation using the same reference oscillator signal that was used in the first modulation. In effect, a first modulation is achieved at a first frequency, the first modulation is then demodulated to zero frequency, and, in turn, a second modulation is achieved at a second frequency.

SUMMARY OF THE INVENTION

An embodiment of the present invention that is described herein provides a communication apparatus including transmission circuitry and a frequency conversion unit. The transmission circuitry is configured to down-convert an input Intermediate Frequency (IF) signal using a transmit (TX) Local Oscillator (LO) signal so as to produce a TX baseband signal, to up-convert the TX baseband signal to produce an output Radio Frequency (RF) signal, and to send the output RF signal to an antenna. The frequency correction unit is configured to estimate a frequency of the TX baseband signal or of the input IF signal, and to adjust the TX LO signal based on the estimated frequency so as to cause the transmission circuitry to down-convert the input IF signal to a predefined target frequency.

In some embodiments, the transmission circuitry and the frequency control unit are included in an Outdoor Unit (ODU), and the transmission circuitry is configured to receive the input IF signal over a cable from an Indoor Unit (IDU). Typically, the IDU includes an up-converter that is configured to produce the input IF signal. In a disclosed embodiment, the predefined target frequency is zero Hz.

In an embodiment, the input IF signal includes a modulated signal, and the frequency correction unit is configured to recover a carrier of the modulated signal and to adjust the TX LO signal based on the recovered carrier. In another embodiment, the frequency correction unit is configured to recover the carrier of the modulated signal using one of a blind estimation process, a decision-directed estimation process and a data-aided estimation process.

In some embodiments, the apparatus further includes reception circuitry, which is configured to down-convert an input RF signal to produce a receive (RX) baseband signal, to up-convert the RX baseband signal using a RX LO signal so as to produce an output IF signal having a desired frequency, and to output the output IF signal, and the frequency correction unit is configured to adjust the RX LO signal responsively to the estimated frequency.

There is additionally provided, in accordance with an embodiment of the present invention, a communication apparatus including transmission circuitry, reception circuitry and a frequency correction unit. The transmission circuitry is configured to produce and transmit an output Radio Frequency (RF) signal. The reception circuitry is configured to down-convert an input RF signal to produce a receive (RX) baseband signal, to up-convert the RX baseband signal using a RX LO signal so as to produce an output IF signal, and to output the output IF signal. The frequency correction unit is configured to estimate a signal frequency used in the transmission circuitry, and to adjust the RX LO signal responsively to the estimated signal frequency.

In some embodiment, the transmission circuitry is configured to produce the output RF signal by down-converting an input IF signal using a TX LO signal so as to produce a TX baseband signal and then up-converting the TX baseband signal to produce the output RF signal, and the signal frequency includes a frequency of the TX baseband signal or of the input IF signal. In an embodiment, the transmission circuitry, the reception circuitry and the frequency control unit are included in an Outdoor Unit (ODU), and the reception circuitry is configured to send the output IF signal over a cable to an Indoor Unit (IDU).

There is also provided, in accordance with an embodiment of the present invention, a communication system that includes a transmitter and a receiver. The transmitter includes an Indoor Unit (IDU) and an Outdoor Unit (ODU). The IDU is configured to produce an Intermediate Frequency (IF) signal and to send the IF signal over a cable. The ODU is configured to accept the IF signal from the cable, to up-convert the IF signal so as to produce a Radio Frequency (RF) signal, and to transmit the RF signal over a wireless channel. The receiver is configured to receive the RF signal from the wireless channel, to process the RF signal so as to estimate a frequency error introduced by a difference between respective clock frequencies of the IDU and the ODU, and to transmit to the transmitter feedback so as to cause the transmitter to correct the frequency error.

There is further provided, in accordance with an embodiment of the present invention, a communication method that includes down-converting an input Intermediate Frequency (IF) signal using a transmit (TX) Local Oscillator (LO) signal so as to produce a TX baseband signal. The TX baseband signal is up-converted to produce an output Radio Frequency (RF) signal, and the output RF signal is sent to an antenna. A frequency of the TX baseband signal or of the input IF signal is estimated, and the TX LO signal is adjusted based on the estimated frequency so as to cause the input IF signal to be down-converted to a predefined target frequency.

There is also provided, in accordance with an embodiment of the present invention, a communication method that includes producing and transmitting an output Radio Frequency (RF) signal using transmission circuitry. An input RF signal is down-converted using reception circuitry to produce a receive (RX) baseband signal. The RX baseband signal is up-converted using a RX LO signal so as to produce an output IF signal, and the output IF signal is output. A signal frequency used in the transmission circuitry is estimated, and the RX LO signal is adjusted responsively to the estimated signal frequency.

There is additionally provided, a communication method that includes producing an Intermediate Frequency (IF) signal in an Indoor Unit (IDU) of a transmitter, and sending the IF signal over a cable. The IF signal is accepted from the cable in an Outdoor Unit (ODU) of the transmitter, the IF signal is up-converted so as to produce a Radio Frequency (RF) signal, and the RF signal is transmitted to a receiver. In the receiver, the RF signal is received and processed so as to estimate a frequency error introduced by a difference between respective clock frequencies of the IDU and the ODU. Feedback indicative of the frequency error is transmitted to the transmitter. The frequency error is corrected in the transmitter responsively to the feedback.

The present invention will be more fully understood from the following detailed description of the embodiments thereof, taken together with the drawings in which:

BRIEF DESCRIPTION OF THE DRAWINGS

FIG. 1 is a block diagram that schematically illustrates a re-modulation transmitter, in accordance with an embodiment of the present invention;

FIG. 2 is a flow chart that schematically illustrates a method for transmission in a re-modulation transmitter, in accordance with an embodiment of the present invention;

DETAILED DESCRIPTION OF EMBODIMENTS

Overview

Figure 3:
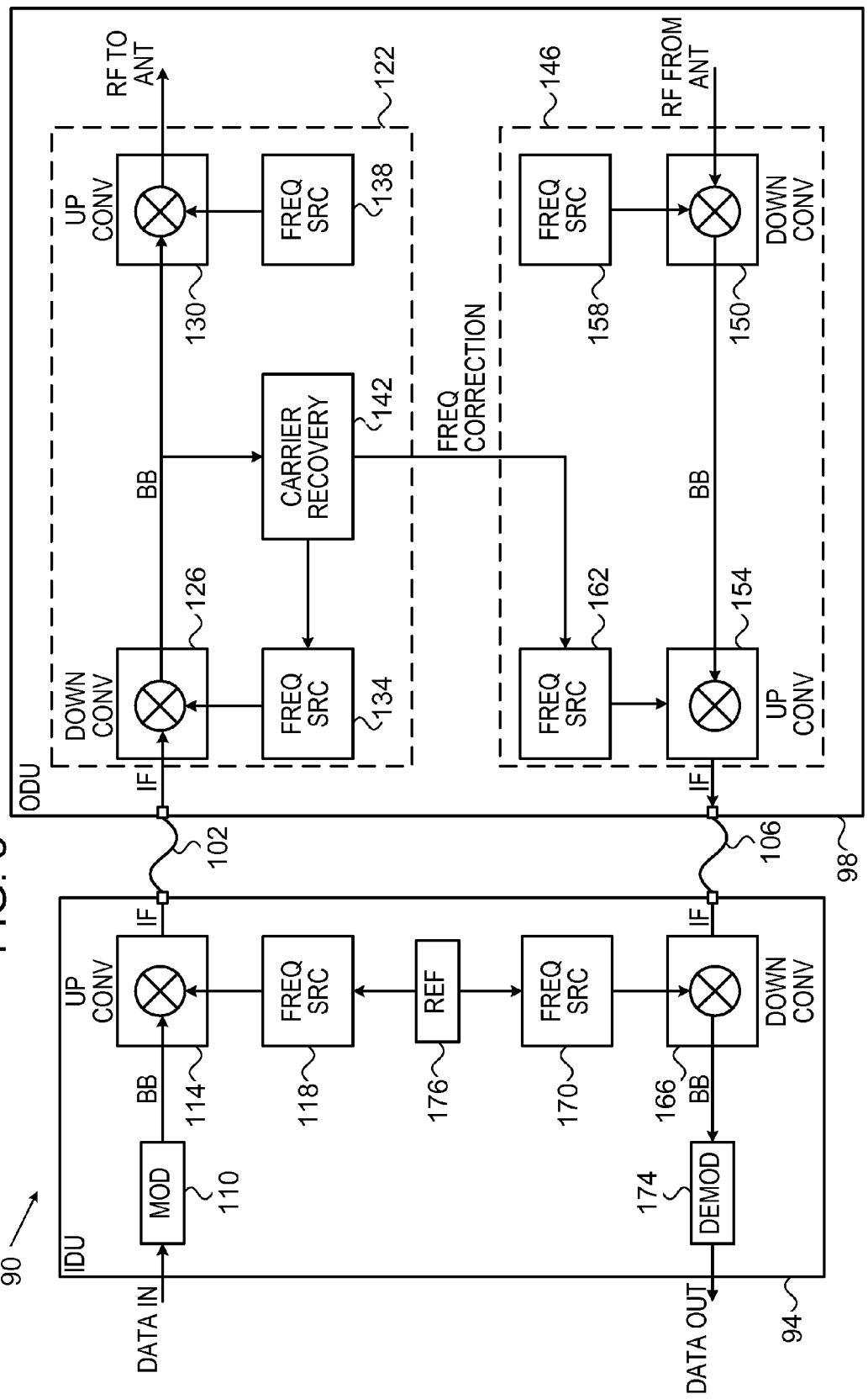
FIG. 3 is a block diagram that schematically illustrates a transceiver that uses re-modulation and re-demodulation, in accordance with an embodiment of the present invention.

Some communication transmitters use re-modulation schemes. In a re-modulation transmitter, an input Intermediate Frequency (IF) signal is first down-converted to baseband, and the baseband signal is then up-converted to Radio Frequency (RF) and transmitted. Re-modulation schemes are used, for example, in split-mount transmitters whose functions are split between an Indoor Unit (IDU) and an Outdoor Unit (ODU) that are connected by a cable. The ODU in a split-mount transmitter may apply re-modulation, i.e., accept an IF signal from the IDU, down-convert the IF signal to baseband, up-convert the baseband signal to RF and transmit the resulting RF signal.

Embodiments of the present invention that are described hereinbelow provide improved re-modulation transmitter configurations and associated methods. In some embodiments, a re-modulation transmitter down-converts the input IF signal to baseband by mixing the IF signal with a Local Oscillator (LO) signal. The baseband signal may have a certain frequency error, for example because of frequency offsets in the input IF signal or in the LO signal used for down-conversion.

In some embodiments, the transmitter comprises a frequency correction unit, which corrects for this frequency error. The frequency correction unit applies a closed-loop carrier recovery process, which estimates the frequency error in the baseband signal and adjusts the LO signal based on the estimated frequency error. As a result, the down-conversion operation produces an accurate baseband signal having little or no frequency error. The accurate baseband signal is then up-converted to RF and transmitted.

Typically, the frequency correction unit estimates the frequency of the baseband signal or of the input IF signal, and adjusts the LO signal so as to cause the transmitter to down-convert the input IF signal to a predefined target frequency. In a typical embodiment, the predefined target frequency is zero Hz.

The disclosed frequency correction techniques are useful, for example, because they simplify compensation for In-Phase/Quadrature (I/Q) imbalance. The disclosed techniques remove any frequency offset that may intervene between I/Q imbalance occurring in the IDU and I/Q imbalance occurring in the ODU. As a result, the IDU-related and ODU-related I/Q imbalance can be modeled as a single composite I/Q imbalance and corrected accordingly. Moreover, the disclosed techniques enable the transmitter to achieve high frequency accuracy, irrespective of any frequency offsets that may exist in the IF signal and/or LO signal. When implemented in an ODU of a split-mount transmitter, the disclosed techniques do not require transfer of any reference clock signals between the IDU and ODU. Moreover, the disclosed ODU configurations can be operated with legacy IDUs, i.e., without requiring changes in the IDU configuration.

Additional embodiments that are described herein provide communication transceivers that apply re-modulation in the transmission path, and re-demodulation in the reception path. In these embodiments, the frequency correction unit adjusts an LO used for re-demodulation in the receiver based on the estimated frequency error of the re-modulation transmitter. In other embodiments, the transmitter corrects its frequency errors based on feedback that is received from a remote receiver.

Frequency Correction in Re-Modulation Transmitter

FIG. 1 is a block diagram that schematically illustrates a re-modulation transmitter 20, in accordance with an embodiment of the present invention. A transmitter of this sort can be used, for example, in a point-to-point microwave or millimeter-wave communication link, or in any other suitable communication system. Transmitter 20 comprises an Indoor Unit (IDU) 24 and an Outdoor Unit (ODU) 28, which are connected to one another by a cable 32, e.g., a coaxial cable or other suitable transmission line. This system configuration is referred to herein as a split-mount configuration.

Input data for transmission is provided to IDU 24. A modulator 36 modulates the data, so as to produce a modulated baseband signal. An up-converter 40 up-converts the baseband signal to a certain Intermediate frequency (IF). In the present example, the IF signal has a frequency of 350 MHz, although any other suitable frequency can also be used. Up-converter 40 up-converts the baseband signal by mixing it with a Local Oscillator (LO) signal that is produced by a frequency source 44. The IF signal is sent over cable 32 to ODU 28.

In ODU 28, a down-converter 48 down-converts the IF signal to baseband by mixing the IF signal with an LO signal that is produced by a frequency source 60. An up-converter 52 up-converts the baseband signal produced by down-converter 48 to RF. Up-conversion is performed by mixing the baseband signal with a LO signal that is produced by a frequency source 64. The RF signal is transmitted via an antenna 56 to a remote receiver (not shown in the figure).

Frequency sources 44, 60 and 64 may comprise any suitable type of frequency source, such as Phase-Locked Loops (PLLs). In some embodiments, the LO signals in the IDU are locked to a certain reference clock signal, and the LO signals in the ODU are locked to a separate reference clock signal.

Each of the IDU and ODU may comprise a respective clock source, such as a Temperature-Controlled Crystal Oscillator (TCXO), which generates the respective reference clock signal. Generally, the reference clock signals in the IDU and ODU are not synchronized to one another. Even if the IDU and ODU frequencies were to be synchronized at some point in time, the synchronization would be lost after a short period of time due to different operating conditions (e.g., temperature, supply voltage and aging effects) between the IDU and ODU. Thus, a frequency error would typically develop between the IDU and the ODU even if initial synchronization, e.g., factory calibration, is performed.

As can be appreciated, the frequency sources in transmitter 20 have finite frequency accuracies. As a result, the various frequency conversion operations in the transmitter may introduce frequency errors into the transmitted signal. In particular, when the frequency sources in the IDU and in the ODU are locked to different reference clocks, the ODU and IDU may have a frequency error with respect to one another. As a result of this frequency error, the down-conversion operation applied by down-converter 48 may not convert the IF signal accurately to baseband, but to some other low frequency. This inaccuracy may cause difficulty in compensating for I/Q imbalance in the transmitter. (In an embodiment, some of the frequency error between the IDU and ODU can be calibrated during initialization of transmitter 20. Nevertheless, as explained above, some residual frequency error will typically remain.)

In some embodiments, ODU 28 comprises a carrier recovery unit 68 (also referred to as a frequency correction unit), which corrects the frequency error between the IDU and the ODU. Unit 68 applies a closed-loop carrier recovery process, which estimates the frequency error in the baseband signal produced by down-converter 48. Unit 68 controls frequency source 60 based on the estimated frequency error, in order to correct the frequency error in the baseband signal. In other words, unit 68 adjusts the LO signal produced by frequency source 60, so as to correct the frequency error.

Typically, the closed-loop process in unit 68 estimates the frequency of the baseband signal or of the input IF signal, and adjusts the LO signal so as to cause down-converter 48 to down-convert the input IF signal to a predefined target frequency. In a typical embodiment, the predefined target frequency is zero Hz.

As a result of the frequency correction applied by unit 68, the IF signal is down-converted accurately to baseband by down-converter 48. As such, compensation for I/Q imbalance is simplified. In addition, the subsequent up-conversion to RF by up-converter 52 becomes accurate, and the RF signal at the transmitter output can reach the desired frequency with high accuracy.

Unit 68 may apply any suitable carrier recovery process in order to estimate and correct the frequency error in the baseband signal. The carrier recovery process typically recovers the carrier frequency or phase of the modulated signal in the baseband signal, and adjusts the LO signal produced by frequency source 60 based on the recovered carrier.

In an example embodiment, carrier recovery unit 68 demodulates the baseband signal using a Phase Locked Loop (PLL) that performs data recovery. In another embodiment, unit 68 may comprise a blind estimator, such as a quadricorrelator. Examples of quadricorrelators that can be used for this purpose are described by D'Andrea and Mengali, in "Design of Quadricorrelators for Automatic Frequency Control Systems," IEEE Transactions on Communications, volume 41, no. 6, June, 1993, which is incorporated herein by reference. The estimation process may comprise a blind, decision-directed or data-aided process. Further alternatively, any other suitable carrier recovery scheme can also be used.

In the embodiment of FIG. 1, unit 68 estimates the frequency error by processing the baseband signal at the output of down-converter 48. In alternative embodiments, unit 68 may estimate the frequency error by processing the IF input signal at the input of down-converter 48, e.g., using IF sampling or IF sub-sampling.

The frequency correction applied by unit 68 enables transmitter 20 to compensate for I/Q imbalance effects in a straightforward manner, since the I/Q imbalance generated in the IDU and the I/Q imbalance generated in the ODU are not intervened by a frequency offset. Certain aspects of correcting I/Q imbalance in the presence of intervening frequency offsets are addressed in U.S. patent application Ser. No. 12/702,351, entitled "correction of Alternating I/Q Imbalance and Frequency Offset Impairments," which is assigned to the assignee of the present patent application and whose disclosure is incorporated herein by reference.

The frequency correction also enables the transmitter to produce an accurate RF signal, even in the presence of large frequency errors between the IDU and the ODU. As a result, it is not necessary to synchronize the frequency sources in the IDU and ODU, e.g., by transferring a reference clock signal over cable 32. Moreover, since the frequency correction is applied in the ODU without involving the IDU, the disclosed technique can be implemented with legacy IDUs, without requiring changes in the IDU configuration.

FIG. 2 is a flow chart that schematically illustrates a method for transmission in a re-modulation transmitter, in accordance with an embodiment of the present invention. The method begins with IDU 24 of transmitter 20 accepting input data for transmission. The IDU modulates the data so as to produce a modulated baseband signal, up-converts the baseband signal to IF, and sends the IF signal over cable 32 to ODU 28, at an IF generation step 70.

ODU 28 accepts the IF signal from cable 32. Down-converter 48 down-converts the IF signal to baseband by mixing it with the LO signal produced by frequency source 60, at a down-conversion step 74. Carrier recovery unit 68 estimates the frequency error in the baseband signal produced by down-converter 48, at a carrier recovery step 78. Based on the estimated frequency error, unit 68 adjusts the LO signal produced by frequency source 60, at a LO adjustment step 82. As a result, down-converter 48 produces an accurate baseband signal having little or no frequency error. Up-converter 52 up-converts the baseband signal to RF, at an up-conversion step 86. The RF signal is transmitted via antenna 56.

Frequency Correction in
Re-Modulation/Re-Demodulation Transceiver

FIG. 3 is a block diagram that schematically illustrates a split-mount transmitter-receiver (transceiver) 90 that uses re-modulation and re-demodulation, in accordance with an embodiment of the present invention. Transceiver 90 comprises an IDU 94 and an ODU 98, which are interconnected by cables 102 and 106. In the present example, the transceiver uses separate cables for transmission and reception. This configuration, however, is presented purely for the sake of clarity. In alternative embodiments, the transmitted and received signals can be multiplexed on a single cable.

The transmission path in transceiver 90 is similar to that of transmitter 20 of FIG. 1 above. In IDU 94, a modulator 110 modulates the input data, so as to produce a modulated baseband signal. An up-converter 114 up-converts the baseband signal to IF, by mixing the baseband signal with an LO signal that is produced by a frequency source 118. The IF signal is sent over cable 102 to ODU 98.

In the ODU, the IF signal is provided to an ODU transmit section 122. A down-converter 126 down-converts the IF signal to baseband, by mixing the IF signal with an LO signal that is produced by a frequency source 134. An up-converter 130 up-converts the baseband signal to RF, by mixing the baseband signal with a LO signal that is produced by a frequency source 138. The RF signal is provided to a transmit antenna and transmitted toward a remote transceiver (not shown in the figure).

A carrier recovery unit 142 estimates the frequency error in the baseband signal produced by down-converter 126, and adjusts the LO signal produced by frequency source 134 based on the estimated frequency error. The functionality of unit 142 is similar to that of unit 68 of FIG. 1 above. As noted above, in alternative embodiments unit 142 may estimate the frequency error by processing the input IF signal (at the input of down-converter 126), instead of processing the baseband signal.

The reception path in transceiver 90 comprises an ODU receive section 146. A down-converter 150 accepts a RF signal from the remote transceiver via a receive antenna (which may be the same antenna as the transmit antenna, or a separate antenna). Down-converter 150 down-converts the received RF signal to baseband, by mixing the RF signal with an LO signal produced by a frequency source 158. An up-converter 154 up-converts the baseband signal to IF, by mixing the baseband signal with an LO signal produced by a frequency source 162. In the present example, the IF signal has a frequency of 140 MHZ, although any other suitable frequency can also be used. The IF signal is send over cable 106 to IDU 94. In the IDU, a down-converter 166 down-converts the IF signal to baseband by mixing it with an LO signal produced by a frequency source 170. A demodulator 174 demodulates the baseband signal and reconstructs the data transmitted by the remote transceiver.

In the present example, frequency sources 118 and 170 in the IDU are assumed to be locked to a common reference clock. A reference clock source 176 generates this common clock and provides it to frequency sources 118 and 170. The frequency sources in the ODU are also assumed to be locked to a common reference clock, which is separate from the reference clock of the IDU. Under these circumstances, the relative frequency error between the IDU and ODU will be similar in the transmission path and in the reception path. In particular, the relative frequency error in the baseband signal produced by down-converter 126 will be similar to the relative frequency error in the IF signal produced by up-converter 154.

In some embodiments, transceiver 90 corrects the frequency error in the reception path based on the estimated frequency error in the transmission path. Referring to the example of FIG. 3, unit 142 adjusts the LO signal produced by frequency source 162, based on the frequency error that was measured in the baseband signal produced by down-converter 126. As a result, the frequency error between the IDU and ODU in the reception path is reduced or eliminated. Down-converter 166 therefore produces an accurate baseband signal, which improves the demodulation performance of demodulator 174.

As noted above with respect to FIG. 1, the disclosed frequency correction technique eliminates the need to transfer a reference clock signal between the IDU and ODU. Moreover, the disclosed technique is applied in the ODU, and can therefore be used with legacy IDUs without modification.

In alternative embodiments, transceiver 90 may perform re-demodulation in receive section 146 but not re-modulation in transmit section 122. In such embodiments, unit 142 estimates the frequency error by processing the transmitted signal (e.g., the IF signal at the input of the ODU) and uses the estimated frequency error to correct the frequency used for re-demodulation in receive section 146.

The configurations of transmitter 20 of FIG. 1 and transceiver 90 of FIG. 3 are example configurations, which were chosen purely for the sake of conceptual clarity. In alternative embodiments, any other suitable configurations can also be used. The different elements of transmitter 20 and transceiver 90 may be implemented using discrete components, Radio Frequency Integrated Circuits (RFICs), Monolithic Microwave Integrated Circuits (MMICs) or any other suitable hardware.

Frequency Correction Based on Feedback from Remote Receiver

Additionally or alternatively, a re-modulation transmitter may correct its frequency error based on feedback that is received from the remote receiver with which it communicates.

Figure 4:
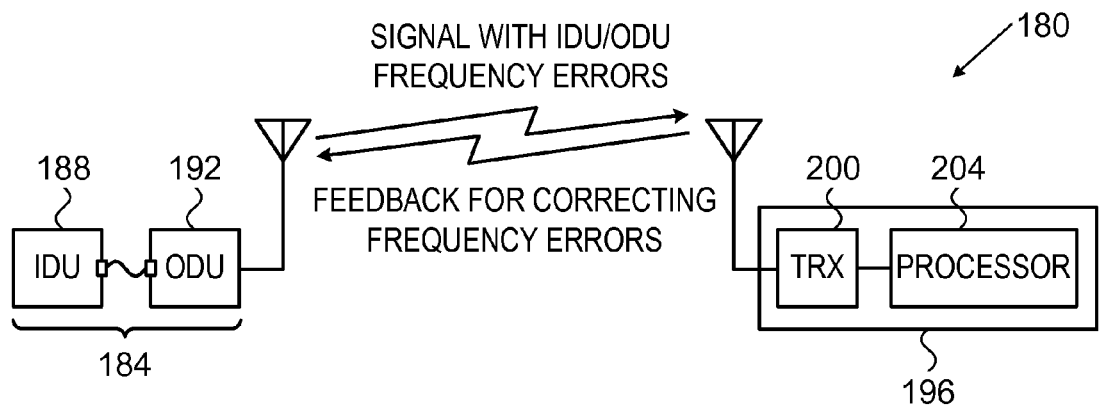
FIG. 4 is a block diagram that schematically illustrates a re-modulation communication system, in accordance with an embodiment of the present invention.

FIG. 4 is a block diagram that schematically illustrates a re-modulation communication system 180, in accordance with an embodiment of the present invention. System 180 comprises a split-mount terminal 184, which uses a re-modulation configuration in the transmission path, as described above. Terminal 184 comprises an IDU 188 and an ODU 192. Terminal 184 communicates with a remote terminal 196. The remote terminal comprises a transceiver (TRX) 200 and a processor 204.

In some practical cases, the RF signal transmitted from terminal 184 to terminal 196 has frequency errors that are caused by IDU 188 and/or ODU 192. In some embodiments, TRX 200 in terminal 196 receives this RF signal. Processor 204 estimates the frequency error in the received signal, and sends to terminal 184 (using TRX 200) feedback that is indicative of the estimated frequency error. Terminal 184 receives the feedback from terminal 196, and corrects the frequency error accordingly.

Processor 204 may use any suitable method for estimating the frequency error in the received signal. For example, TRX 200 may down-convert the received signal to baseband, and processor 204 may analyze the baseband signal. In an example embodiment, the signal comprises modulated symbols that are drawn from a certain symbol constellation in the In-phase/Quadrature (I/Q) plane. Processor 204 may measure the angular rate at which the modulated symbols rotate in the I/Q plane. Since the phase rotation rate is proportional to the frequency error in the signal, processor 204 may estimate the frequency error based on the measured phase rotation rate.

Typically, system 180 has two different frequency errors that are treated separately. One frequency error is caused by the re-modulation (the frequency error caused by the difference in clock frequency between the transmission circuitry in IDU 188 and ODU 192). The second frequency error is between terminal 184 (transmitter) and terminal 196 (receiver). The second frequency error is typically estimated and compensated in the receiver of terminal 196. In an embodiment, the receiver of terminal 196 applies a second estimation that estimates the first frequency error and transmits it back to terminal 184. This additional estimation is particularly useful for estimating and correcting I/Q imbalance, as explained above.

Figure 5:
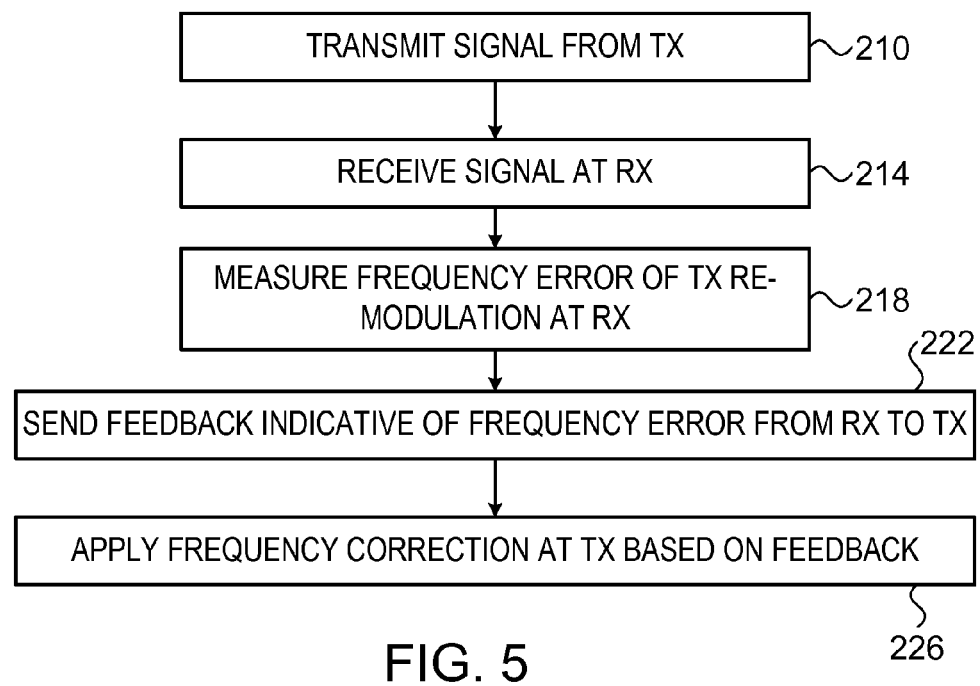
FIG. 5 is a flow chart that schematically illustrates a method for frequency correction in a re-modulation communication system, in accordance with an embodiment of the present invention.

FIG. 5 is a flow chart that schematically illustrates a method for frequency correction in system 180, in accordance with an embodiment of the present invention. The method begins with terminal 184 transmitting a signal to terminal 196, at a transmission step 210. Terminal 196 receives the signal, at a remote reception step 214. Terminal 196 measures the frequency error in the received signal, which is caused by differences between the IDU and ODU clocks, at an error estimation step 218. Terminal 196 sends to terminal 180 feedback, which is indicative of the measured frequency error, at a feedback transmission step 222. Terminal 184 applies frequency correction in its transmitter based on the received feedback, at a correction step 226.

Although the embodiments described herein refer mainly to re-modulation transmitters and re-demodulation receivers, the disclosed techniques can also be used in other applications. For example, a demodulating repeater (which down-converts and demodulates a received signal, and then re-modulates and up-converts it for retransmission) may apply the disclosed carrier recovery techniques in order to adjust its transmission frequency.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A communication apparatus, comprising:
a transmission circuit configured to down-convert an input Intermediate Frequency (IF) signal using a transmit (TX) Local Oscillator (LO) signal so as to produce a TX baseband signal, to up-convert the TX baseband signal to produce an output Radio Frequency (RF) signal, and to send the output RF signal to an antenna; and
a frequency correction unit configured to estimate a frequency of the TX baseband signal or of the input IF signal, and to adjust the TX LO signal based on the estimated frequency to cause the transmission circuit to down-convert the input IF signal to a predefined target frequency;
wherein the input IF signal comprises a modulated signal, and wherein the frequency correction unit is further configured to recover a carrier of the modulated signal and to adjust the TX LO signal based on the recovered carrier.

2. The apparatus according to claim 1, wherein the transmission circuit and the frequency correction unit are comprised in an Outdoor Unit (ODU), and wherein the transmission circuit is further configured to receive the input IF signal over a cable from an Indoor Unit (IDU).

3. The apparatus according to claim 2, wherein the IDU comprises an up-converter configured to produce the input IF signal.

4. The apparatus according to claim 1, wherein the predefined target frequency comprises zero Hz.

5. The apparatus according to claim 1, wherein the frequency correction unit is further configured to recover the carrier of the modulated signal using one of: a blind estimation process, a decision-directed estimation process, and a data-aided estimation process.

6. A communication apparatus, comprising:
a transmission circuit configured to down-convert an input Intermediate Frequency (IF) signal using a transmit (TX) Local Oscillator (LO) signal to produce a TX baseband signal, to up-convert the TX baseband signal to produce an output Radio Frequency (RF) signal, and to send the output RF signal to an antenna;
a frequency correction unit configured to estimate a frequency of the TX baseband signal or of the input IF signal and to adjust the TX LO signal based on the estimated frequency to cause the transmission circuit to down-convert the input IF signal to a predefined target frequency; and
a reception circuit configured to down-convert an input RF signal to produce a receive (RX) baseband signal, to up-convert the RX baseband signal using a RX LO signal to produce an output IF signal having a desired frequency, and to output the output IF signal;
wherein the frequency correction unit is further configured to adjust the RX LO signal responsively to the estimated frequency.

7. A communication apparatus, comprising:
a transmission circuit configured to produce and transmit an output Radio Frequency (RF) signal;
a reception circuit configured to down-convert an input RF signal to produce a receive (RX) baseband signal, to up-convert the RX baseband signal using a RX Local Oscillator (LO) signal to produce an output IF signal, and to output the output IF signal; and
a frequency correction unit configured to estimate a signal frequency used in the transmission circuit and to adjust the RX LO signal responsively to the estimated signal frequency.

8. The apparatus according to claim 7, wherein the transmission circuit is further configured to produce the output RF signal by down-converting an input IF signal using a transmit (TX) LO signal to produce a TX baseband signal and to up-convert the TX baseband signal to produce the output RF signal, and wherein the signal frequency comprises a frequency of the TX baseband signal or of the input IF signal.

9. The apparatus according to claim 7, wherein the transmission circuit, the reception circuit and the frequency correction unit are comprised in an Outdoor Unit (ODU), and wherein the reception circuit is further configured to send the output IF signal over a cable to an Indoor Unit (IDU).

10. A communication system, comprising:
a transmitter, comprising:
an Indoor Unit (IDU) configured to produce an Intermediate Frequency (IF) signal and to send the IF signal over a cable; and
an Outdoor Unit(ODU) configured to accept the IF signal from the cable, to up-convert the IF signal to produce a Radio Frequency (RF) signal, and to transmit the RF signal over a wireless channel; and
a receiver configured to receive the RF signal from the wireless channel, to process the RF signal to estimate a frequency error introduced by a difference between respective clock frequencies of the IDU and the ODU, and to transmit to the transmitter feedback to cause the transmitter to correct the frequency error.

11. A communication method, comprising:
down-converting an input Intermediate Frequency (IF) signal using a transmit (TX) Local Oscillator (LO) signal to produce a TX baseband signal;
up-converting the TX baseband signal to produce an output Radio Frequency (RF) signal and sending the output RF signal to an antenna; and
estimating a frequency of the TX baseband signal or of the input IF signal and adjusting the TX LO signal based on the estimated frequency to cause the input IF signal to be down-converted to a predefined target frequency;
wherein the input IF signal comprises a modulated signal, and
wherein the estimating the frequency and the adjusting the TX LO signal comprise:
  recovering a carrier of the modulated signal and adjusting the TX LO signal based on the recovered carrier.

12. The method according to claim 11, wherein the down-converting of the input IF signal, the up-converting of the TX baseband signal, the estimating of the frequency and the adjusting of the TX LO signal are performed in an Outdoor Unit (ODU), and further comprising receiving the input IF signal over a cable from an Indoor Unit (IDU).

13. The method according to claim 12, further comprising producing the input IF signal using an up-converter in the IDU.

14. The method according to claim 11, wherein the predefined target frequency comprises zero Hz.

15. The method according to claim 11, further comprising applying one of: a blind estimation process, a decision-directed estimation process, and a data-aided estimation process to recover the carrier of the modulated signal.

16. A communication method comprising:
  down-converting an input Intermediate Frequency (IF) signal using a transmit (TX) Local Oscillator (LO) signal to produce a TX baseband signal;
  up-converting the TX baseband signal to produce an output Radio Frequency (RF) signal and, sending the output RF signal to an antenna;
  estimating a frequency of the TX baseband signal or of the input IF signal and adjusting the TX LO signal the estimated frequency to cause the input IF signal to be down converted to a predefined target frequency; and
  down-converting an input RF signal to produce a receive (RX) baseband signal, up-converting the RX baseband signal using a RX LO signal to produce an output IF signal having a desired frequency, outputting the output IF signal, and adjusting the RX LO signal responsively to the estimated frequency.

17. A communication method, comprising:
  using transmission circuitry, producing and transmitting an output Radio Frequency (RF) signal;
  using reception circuitry, down-converting an input RF signal to produce a receive (RX) baseband signal, up-converting the RX baseband signal using a RX Local Oscillator (LO) signal to produce an output Intermediate Frequency (IF) signal, and outputting the output IF signal; and
  estimating a signal frequency used in the transmission circuitry and adjusting the RX LO signal responsively to the estimated signal frequency.

18. The method according to claim 17, wherein producing the output RF signal comprises down-converting an input IF signal using a transmit (TX) LO signal to produce a TX baseband signal and up-converting the TX baseband signal to produce the output RF signal, and wherein the signal frequency comprises a frequency of the TX baseband signal or of the input IF signal.

19. The method according to claim 17, wherein the transmitting of the output RF signal, the down-converting of the input RF signal, the up-converting of the RX baseband signal, and the estimating of the signal frequency are performed in an Outdoor Unit (ODU), and further comprising sending the output IF signal over a cable to an Indoor Unit (IDU).

20. A communication method, comprising:
  producing an Intermediate Frequency (IF) signal in an indoor Unit (IDU) of a transmitter, and sending the IF signal over a cable;
  in an Outdoor Unit (ODU) of the transmitter, accepting the IF signal from the cable, up-converting the IF signal to produce a Radio Frequency (RF) signal, and transmitting the RF signal to a receiver;
  in the receiver, receiving the RF signal, processing the RF signal to estimate a frequency error introduced by a difference between respective clock frequencies of the IDU and the ODU and transmitting to the transmitter feedback indicative of the frequency error; and
  correcting the frequency error in the transmitter responsively to the feedback.

* * * * *

UNITED STATES PATENT AND TRADEMARK OFFICE
CERTIFICATE OF CORRECTION

PATENT NO. : 8,406,709 B2
APPLICATION NO. : 13/035972
DATED : March 26, 2013
INVENTOR(S) : Kushnir et al.

It is certified that error appears in the above-identified patent and that said Letters Patent is hereby corrected as shown below:

In the Claims

Column 10, line 21, please replace "transmit" with --to transmit--.
Column 10, line 21, please replace "circuit" with --circuit,--.
Column 10, line 49, please replace "Outdoor Unit(ODU)" with --Outdoor Unit (ODU)--.
Column 11, line 25, please replace "method" with --method,--.
Column 11, line 30, please replace "and, sending" with --and sending--.
Column 11, line 33, please replace "signal the" with --signal based on the--.
Column 11, lines 34-35, please replace "down converted" with --down-converted--.

Signed and Sealed this
Fourteenth Day of May, 2013

Teresa Stanek Rea
*Acting Director of the United States Patent and Trademark Office*